(12) United States Patent
Akiyama et al.

(10) Patent No.: US 8,772,132 B2
(45) Date of Patent: Jul. 8, 2014

(54) METHOD OF MANUFACTURING LAMINATED WAFER BY HIGH TEMPERATURE LAMINATING METHOD

(71) Applicant: Shin-Etsu Chemical Co., Ltd., Tokyo (JP)

(72) Inventors: Shoji Akiyama, Annaka (JP); Yoshihiro Kubota, Annaka (JP); Atsuo Ito, Annaka (JP); Makoto Kawai, Annaka (JP); Kouichi Tanaka, Annaka (JP); Yuji Tobisaka, Annaka (JP); Yoshihiro Nojima, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/930,705

(22) Filed: Jun. 28, 2013

(65) Prior Publication Data

US 2013/0288453 A1 Oct. 31, 2013

Related U.S. Application Data

(62) Division of application No. 12/685,194, filed on Jan. 11, 2010, now Pat. No. 8,551,862.

(30) Foreign Application Priority Data

Jan. 15, 2009 (JP) ................................ 2009-006408

(51) Int. Cl.
*H01L 21/00* (2006.01)
(52) U.S. Cl.
USPC ........................................................ 438/459

(58) Field of Classification Search
USPC ........................................................ 438/459
See application file for complete search history.

(56) References Cited

U.S. PATENT DOCUMENTS

| 5,500,385 A | 3/1996 | Wendt et al. |
| 2004/0241958 A1 | 12/2004 | Guarini et al. |

(Continued)

FOREIGN PATENT DOCUMENTS

| EP | 1983553 A1 | 10/2008 |
| EP | 1983575 A2 | 10/2008 |

(Continued)

OTHER PUBLICATIONS

Tong et al. "9.1.6 Si/Sapphire Bonding", *Semiconductor Wafer Bonding* pp. 212-214.

(Continued)

*Primary Examiner* — Marvin Payen
(74) *Attorney, Agent, or Firm* — Myers Bigel Sibley & Sajovec, P.A.

(57) ABSTRACT

A method of manufacturing a laminated wafer is provided by forming a silicon film layer on a surface of an insulating substrate comprising the steps in the following order of: applying a surface activation treatment to both a surface of a silicon wafer or a silicon wafer to which an oxide film is layered and a surface of the insulating substrate followed by laminating in an atmosphere of temperature exceeding 50° C. and lower than 300° C., applying a heat treatment to a laminated wafer at a temperature of 200° C. to 350° C., and thinning the silicon wafer by a combination of grinding, etching and polishing to form a silicon film layer.

8 Claims, 2 Drawing Sheets

(56) References Cited

U.S. PATENT DOCUMENTS

| | | |
|---|---|---|
| 2006/0014363 A1 | 1/2006 | Daval et al. |
| 2006/0097317 A1 | 5/2006 | Dantz et al. |
| 2007/0148911 A1 | 6/2007 | Chang et al. |
| 2008/0166891 A1 | 7/2008 | Hirasawa et al. |
| 2008/0194078 A1 | 8/2008 | Akiyama et al. |
| 2009/0047526 A1 | 2/2009 | Ninomiya et al. |
| 2009/0278233 A1 | 11/2009 | Pinnington et al. |
| 2010/0227452 A1 | 9/2010 | Akiyama et al. |

FOREIGN PATENT DOCUMENTS

| | | |
|---|---|---|
| EP | 1986218 A1 | 10/2008 |
| JP | 2007214304 A | 8/2007 |
| JP | 2008198656 A | 8/2008 |

OTHER PUBLICATIONS

Extended European Search Report corresponding to European Application No. 10150864.6 dated Nov. 7, 2011.

Office Action corresponding to Japanese Application No. 2010-003986 issued Oct. 25, 2013.

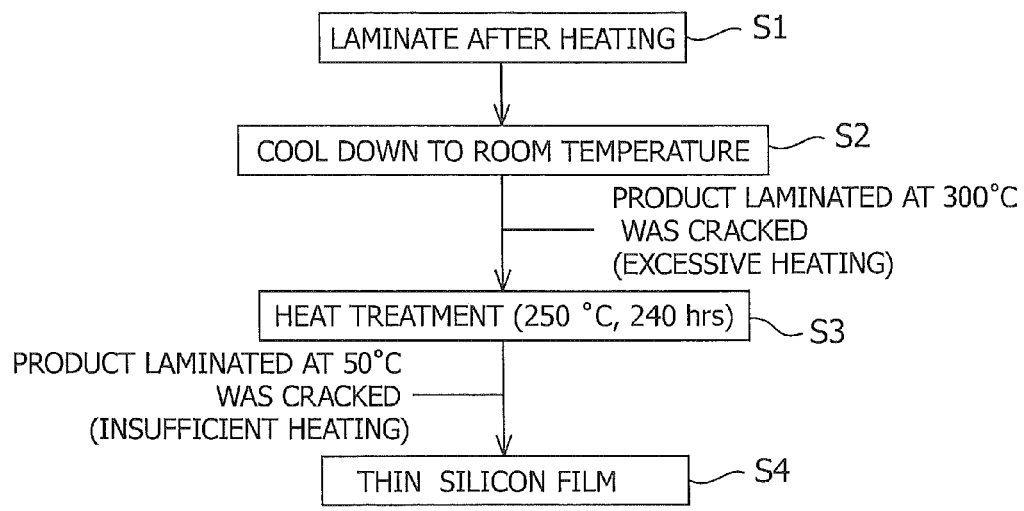
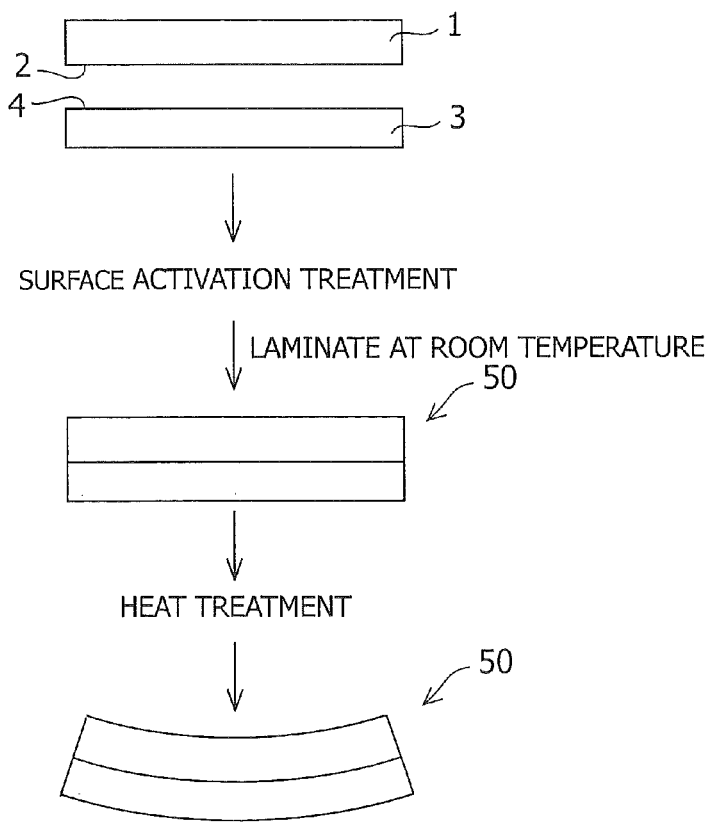

METHOD OF MANUFACTURING LAMINATED WAFER BY HIGH TEMPERATURE LAMINATING METHOD

CROSS-RELATED APPLICATIONS

This application is a divisional of U.S. application Ser. No. 12/685,194, filed Jan. 11, 2010, now allowed, which claims priority from Japanese Patent Application No. 2009-006408; filed Jan. 15, 2009, the disclosure of which is incorporated herein by reference in its entirety.

BACKGROUND OF THE INVENTION

1. Field of the Invention

The invention relates to a method of manufacturing a laminated wafer by a high temperature laminating method.

2. Description of the Related Art

There is conventionally proposed Silicon on Insulator [SOI] wafers called a Silicon on Quartz (SOQ) wafer, a Silicon on Glass (SOG) wafer and a Silicon on Sapphire (SOS) wafer in which a donor wafer made of silicon is bonded to a handle wafer made of e.g. quartz, glass and sapphire. The insulation property and the transparent property of the handle wafer may expand the application of the SOI wafers to e.g. a projector and a high-frequency device. In particular, the SOS wafer has a thermal conductivity about 30 times as high as that of quartz, it may be applied to devices that would generate large amount of heat.

A conventional SOI manufacturing technique as to bonding is mainly categorized into two methods. One method is a SOITEC method. A silicon wafer (donor wafer), which has been subjected to hydrogen-ion-implantation in advance, is bonded with a wafer (handle wafer) acting as a support substrate at a room temperature. The laminated wafer are subjected to heat treatment at a high temperature (about 500° C.), and then delaminated at an ion implantation interface by generating a lot of minute bubbles called micro cavities at the ion implantation interface so as to transfer a silicon film onto the handle wafer.

The other method is called a SiGen method. A wafer, which has been subjected to the hydrogen ion implantation in advance, is bonded with a handle wafer after the surfaces of both the silicon wafer and the handle wafer to be bonded are activated by a plasma treatment, and thereafter the laminated wafer is mechanically delaminated at the hydrogen-ion-implantation interface.

Since the SOITEC method comprises the step of a high temperature heat treatment after the laminating step, when silicon is bonded to a handle wafer such as quartz and sapphire, the handle wafer may be cracked in the step of heat treatment due to a large difference in thermal expansion coefficient. Further, in the SiGen method, although both the wafers have a high coupling strength due to the surface activation treatment in comparison with the SOITEC method when the wafers are bonded, they must be subjected to a heat treatment at 200° C. or higher. As a result, the laminated wafer may be broken due to the difference in thermal expansion coefficient between the wafers or an untransferred portion may be observed in a resultant silicon film.

SUMMARY OF THE INVENTION

The crack of the wafers or the untransferred portion may be stemming from the laminating of wafers made of different material, while the coupling strength of a laminating interface is increased as a temperature increases, due to the failure of uniform progress of the laminating step in a plane due to e.g. delamination.

Note that the thermal expansion coefficient of silicon is $2.6 \times 10^{-6}/K$, whereas the thermal expansion coefficients of quartz and sapphire are $0.56 \times 10^{-6}/K$ and $5.8 \times 10^{-6}/K$, respectively. The difference in the thermal expansion coefficient in the SOQ ($\Delta\alpha = \alpha$ (donor) $-\alpha$ (handle)) is shown by $\Delta\alpha = 2.04 \times 10^{-6}/K$ (in which the compression stress is applied to the silicon layer) and the difference in the thermal expansion coefficient in the SOS is shown by $\Delta\alpha = -3.2 \times 10^{-6}/K$ (in which the tensile stress is applied to the silicon layer). Since the lamination is usually implemented at a room temperature, stress is applied proportionally to the laminating interface as shown by the following Expression (1):

$$\text{Stress applied to interface} \propto \Delta\alpha (=-3.2 \times 10^{-6}/K) \times \Delta T$$
$$(= \text{maximum heat treatment temperature} - \text{laminating temperature}) \quad \text{Expression (1)}$$

Since the bonding strength of a laminating surface depends on a maximum heat treatment temperature (refer to Q. Y. Tong and U. Gosele "Semiconductor Wafer Bonding"), it is desirable that the temperature be high to realize a strong bonding. When the temperature is changed, a new problem such as an insufficient bonding strength may arise.

In view of the above circumstances, an object of the invention is to provide a method of manufacturing a laminated wafer in which a strong bonding is achieved between wafers made of different materials having a large difference in the thermal expansion coefficient without lowering a maximum heat treatment temperature, and without a crack and a chip of the wafer.

To solve the problem, the inventors tried to change a wafer laminating temperature.

That is, a first aspect of the invention may be a method of manufacturing a laminated wafer by forming a silicon film layer on a surface of a transparent insulating substrate, the method comprising the following steps in the following order of: applying a plasma surface activation treatment to a surface of a silicon wafer or a silicon wafer covered with an oxide film and/or to the surface of the insulating substrate; bonding the surfaces to each other at a temperature exceeding 50° C. and lower than 300° C. to obtain a laminated wafer; applying a heat treatment of 200° C. to 350° C. to the laminated wafer; and thinning the silicon wafer of the laminated wafer by a combination of grinding, etching, and polishing to form the silicon film layer on the insulating substrate.

A second aspect of the invention is a method of manufacturing a laminated wafer by forming a silicon film layer on a surface of a transparent insulating substrate, the method comprising the steps in the following order of: implanting ions from a surface of a silicon wafer or a silicon wafer covered with an oxide film to form an ion implantation interface; applying a plasma surface activation treatment to the surface of the insulating substrate and/or to the ion implanted surfaces; laminating the ion implanted surfaces and the surface of the insulating substrate at a temperature exceeding 50° C. and lower than 300° C. to obtain a laminated wafer; applying a heat treatment to the laminated wafer at 200° C. to 350° C.; and applying a mechanical impact to the ion implantation interface to form a silicon film layer so that the silicon film is transferred to form the silicon film layer on the insulating substrate.

The manufacturing method according to the invention is particularly suitable when the insulating substrate is a sapphire or an alumina wafer.

The step of laminating preferably comprises heating, with hot plate apparatus, both of the surface of the insulating substrate and the surface of the silicon wafer or only the surface of the insulating substrate.

An etching solution used in the step of thinning preferably comprises a solution of one or more alkalis selected from a group consisting of KOH, $NH_3$, NaOH, CsOH and $NH_4OH$.

An etching solution used in the step of thinning preferably comprises at least one organic solvent selected from a group consisting of ethylenediamine pyrocatechol water, tetramethylammonium hydroxide and hydrazine.

In the manufacturing method according to the invention, a dose amount of hydrogen ions (H+) implanted to the silicon wafer is preferably from $3.0 \times 10^{16}/cm^2$ to $1.0 \times 10^{17}/cm^2$ or a dose amount of hydrogen molecule ions (H2+) implanted to the silicon wafer is preferably from $1.5 \times 10^{16}/cm^2$ to $5.0 \times 10^{16}/cm^2$.

In the manufacturing method according to the invention, the root-mean-square roughness of the surface of the silicon wafer and/or the surface of the insulating substrate is preferably not more than 0.5 nm.

The manufacturing method of the invention allows obtaining a laminated wafer by which a strong coupling is achieved between wafers made of different materials having a large difference in thermal expansion coefficient while keeping a maximum temperature of the heat treatment without occurrence of a crack and a chip of the wafers.

BRIEF DESCRIPTION OF THE DRAWINGS

FIG. 2 is a schematic view explaining a flow of respective steps in an example; and FIG. 3 is a schematic view showing steps of a conventional room temperature laminating method.

DETAILED DESCRIPTION OF THE PREFERRED EMBODIMENT

Figure 1:
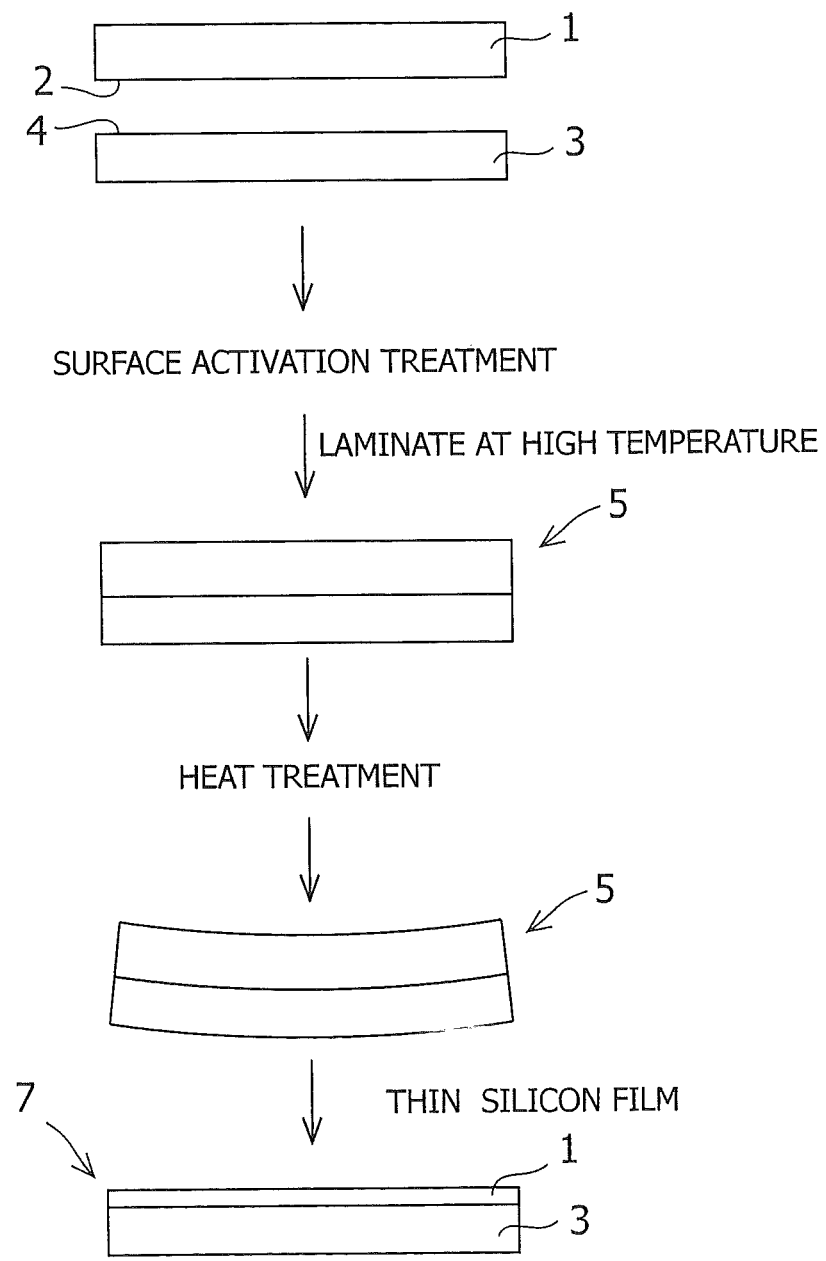
FIG. 1 is a schematic view showing steps of a high temperature laminating method according to the invention.

The present invention now will be described more fully hereinafter in which embodiments of the invention are provided with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

Hereinafter, preferred embodiments of the present invention will be described. However, it is to be understood that the present invention is not limited thereto.

An outline of a high temperature laminating method will be explained based on FIG. 1.

First, a surface (2) of a silicon film (1) of a silicon wafer or a silicon wafer with an oxide film (hereinafter, simply referred to as a silicon wafer unless discriminated) and/or a surface (3) of an insulating substrate (4) are subjected to an activation treatment by plasma.

When the treatment is carried out by the plasma, the silicon wafer and/or the insulating substrate, which are subjected to a rinse such as an RCA rinse, are placed in a chamber and the surfaces of the wafer and the substrate are subjected to the plasma treatment. In the treatment of the silicon wafer, when the surface of the silicon wafer is oxidized, the plasma of an oxide gas may be used, whereas when the surface of the silicon wafer is not oxidized, a hydrogen gas, an argon gas, a nitrogen gas, a mixture of these gases, or a mixture of the hydrogen gas and a helium gas may be used. In the treatment of the insulating substrate, any of the above gases may be used.

By the plasma treatment, the organic substances deposited on the surfaces of the silicon wafer and/or the insulating substrate can be oxidized and removed. The surfaces are further activated by an increase of the OH group on the surfaces.

Other methods of the surface activation may include ozone water treatment, UV ozone treatment and ion-beam treatment.

The mechanism of the increase of the bonding force can be explained in the following while it is not completely known. In the ozone water treatment and the UV ozone treatment, organic substances deposited on a surface of a wafer may be decomposed by ozone, and OH group may be increased on the surface by the treatments. In the ion-beam treatment and the plasma treatment, a surface of a wafer may be activated by exposing a dangling bond at the surface or attaching an OH group to the dangling bond by the treatments.

The ozone water treatment can be performed by immersing the wafer into pure water which dissolves an ozone gas in an amount of about 10 mg/L.

The UV ozone treatment can be performed by irradiating a UV light (having a wavelength of, for example, 185 nm) to ozone gas or ozone gas produced in an atmosphere.

The ion-beam treatment can be performed by subjecting a surface of a wafer to a beam of an inert gas such as argon in a high vacuum in the same manner as the sputtering method to expose dangling bond on a surface and strengthen the bonding force.

Although the treatment is preferably subjected to both the surface of the silicon wafer and the surface of the insulating substrate, it may be implemented to any one of the surfaces.

The degree of the surface activation may be evaluated by observing a degree of hydrophilicity (wetting characteristic). Specifically, it can be easily evaluated by dropping a waterdrop on the activated surface and measuring a contact angle of the surface formed by the waterdrop and the surface.

The silicon wafer to be used may have a diameter of 100 mm to 200 mm and a thickness of 500 µm to 1500 µm, but they are not particularly limited.

Further, the surface of the silicon wafer or the insulating substrate preferably may have a root-mean-square roughness [Rq] of 0.5 nm or less, which is measured in compliance with JIS R 1683:2007. When the root-mean-square roughness [Rq] exceeds 0.5 nm, a bonding itself may not progress.

In the specification, the root-mean-square roughness [Rq] is a value based on an AFM image.

A surface, which is treated by plasma, is bonded to both or one of a surface of the silicon wafer and a surface of the insulating substrate in intimate contact therewith as a joined surface at a temperature exceeding 50° C. and lower than 300° C. Although the laminating temperature at the laminating step is ordinarily a room temperature (=about 25° C.), the stress shown by the expression (1) may be reduced by setting the temperature to a temperature exceeding 50° C. which is higher than the ordinary temperature. The preferable lower limit of the laminating temperature is 60° C., 70° C., 80° C., and 90° C. and the preferable upper limit of the laminating temperature is 290° C., 280° C., 270° C., and 260° C.

The laminating step preferably comprises heating, with hot plate apparatus, both of the surface of the insulating substrate and the surface of the silicon wafer or heating only the surface of the insulating substrate. Time necessary for lamination is about 1 to 10 minutes.

Thereafter, the laminated wafer (5) may be cooled to the room temperature so that it is moved to a subsequent heat treatment apparatus. When the laminating temperature exceeds 300° C., the substrate may be cracked when the laminating temperature is returned to the room temperature. Alternatively, the laminated wafer may be subjected to the subsequent heat treatment step without being cooled to the room temperature after the laminating step. When the laminated wafer is treated at the heat treatment step, a temperature increasing speed is preferably set to 0° C./minute to 5° C./minute, and the difference between a laminating temperature and a heat treatment temperature is preferably from 50° C. to 150° C. When the temperature difference is less than 50° C., the coupling strength between laminated surfaces may become insufficient due to an insufficient temperature, whereas when the temperature difference is 150° C. or higher, cracks may occur due to warpage of the substrate.

The heat treatment step of the laminated wafer may be implemented at 200° C. to 350° C. for 1 to 100 hours so that the bonding force of the interface between two wafers may become strong. The time may depend on a heat treatment temperature.

The heat treatment is then followed by thinning of the silicon layer. The silicon layer of the laminated wafer can be thinned by the following steps of: implanting hydrogen ions to a donor wafer prior to the laminating step to form a hydrogen ion implantation interface; and applying an impact to the hydrogen ion implantation interface to mechanically delaminate a laminated wafer at the interface (the method (1)). Alternatively, the silicon layer can be thinned by a series of the grinding step, the etching step and the polishing step (the method (2)). Instead of the aforementioned hydrogen ion implantation/delamination method, the silicon layer can be thermally delaminated by a crystal rearrangement effect and an aggregation effect of the bubbles of implanted hydrogen at the hydrogen ion implantation interface after being subjected to a heat treatment at about 500° C. in an inert gas atmosphere. The method (1) is preferable among the above methods because it is free of cracks, and free from care of the thermal strain and the delamination of a laminated surface due to heating.

The ion implantation interface is formed in the silicon wafer. At the time, the temperature of the silicon wafer is set to, for example, 250 to 450° C., and hydrogen ions having a predetermined dose amount are implanted by implantation energy by which an ion implantation layer may be formed to a desired depth from the surface of the silicon wafer. As a condition at the time, the implantation energy may be set to, for example, 50 to 100 keV.

The dose amount of hydrogen ions ($H^+$) implanted to the silicon wafer is preferably from $3.0 \times 10^{16}/cm^2$ to $1.0 \times 10^{17}/cm^2$. When the dose amount is less than $3.0 \times 10^{16}/cm^2$, transfer and delamination may become impossible on the ion implantation interface, whereas when the dose amount exceeds $1.0 \times 10^{17}/cm^2$, the implantation interface may become brittle and the substrate may be cracked in the heat treatment. The dose amount is more preferably $5.0 \times 10^{16}/cm^2$. When hydrogen molecule ions ($H_2^+$) are used as implantation ions, the dose amount is preferably from $1.5 \times 10^{16}/cm^2$ to $5.0 \times 10^{16}/cm^2$. When the dose amount is less than $5 \times 10^{16}/cm^2$, transfer and delamination may become impossible on the ion implantation interface, whereas when the dose amount exceeds $5.0 \times 10^{16}/cm^2$, the implantation interface may become brittle and the substrate may be cracked in the heat treatment. The dose amount is more preferably $2.5 \times 10^{16}/cm^2$.

Further, when an insulation film a 50 nm to 500 nm thick silicon oxide film is formed on the surface of the silicon wafer in advance and hydrogen ions are implanted through the insulation film, an effect of suppressing channeling of implantation ions may be obtained.

Although it is sufficient to continuously or intermittently blow a jet of a fluid such as a gas and a liquid from a circumferential surface of the laminated wafer to apply the impact to the ion implantation interface, the method is not particularly limited as long as it is a method of causing a mechanical delamination by an impact.

It may be said that the method (2) is more simple than the method (1) because it does not include an ion implantation step. However, since a silicon film layer is thinned by grinding, etching and polishing in the method (2), the film thickness of the layer may be more varied in the method (1) than in the method (2). Further, when the laminating temperature is high, since the substrate (50) is warped at the time the laminating temperature is returned to the room temperature, although a problem arises in that it becomes difficult to subject the substrate to grinding, it is possible to carry out the grinding.

As an etching solution used for etching, at least one solution of one or more alkalis selected from a group consisting of KOH, $NH_3$, NaOH, CsOH and $NH_4OH$ may be used. Alternatively, an etching solution may comprise one or more organic solvent selected from a group consisting of ethylenediamine pyrocatechol water, tetramethylammonium hydroxide and hydrazine. In general, since the etching speed of organic solvents is slower than that of alkaline solutions, organic solvents are suitable when the accurate control of the etching amount is required.

Although the final film thickness of the silicon film layer is not particularly limited, the final film thickness may be from 50 nm to 500 nm.

The claimed method may use any of e.g. a quartz substrate, a sapphire substrate, and an alumina or glass substrate as an insulating substrate. The manufacturing method may be particularly effective for a sapphire wafer because the sapphire has a large difference in thermal expansion coefficient from that of a silicon film layer and tends to develop a crack and/or a chip in a process as well as an alumina wafer (amorphous) having a similar composition to sapphire.

Since a laminated wafer manufactured by the claimed method is particularly suitable for making a wiring circuit for an electro-optical device such as a liquid crystal device.

Example 1

A Silicon wafer was provided so as to have a diameter of 150 mm, a thickness of 625 μm and a 200-nm-thick oxide film thereon. A sapphire wafer (manufactured by Kyocera) was also prepared. After applying a plasma activation treatment to each surface of the silicon wafer and the sapphire wafer, the activated surfaces of these wafers were laminated. A laminating temperature was set to 50° C., 100° C., 150° C., 200° C., 250° C. and 300° C. respectively. After these wafers were laminated, the laminating temperature was once returned to a room temperature, and the laminated wafer was loaded on a quartz boat for a heat treatment and subjected to the heat treatment at 250° C. for 24 hours. Conditions of the laminated wafers found in a series of experiments were shown in FIG. 2. Table 1 shows the conditions of the laminated wafers after the heat treatment. The wafers laminated at 50° C. or 300° C. were cracked. Regarding the remaining four wafers, silicon layers were etched by KOH (10 wt %, 70° C.), mirror-polished (CMP polishing) and observed through an optical microscope. No defects were observed in these four wafers.

TABLE 1

| | laminating temperature (° C.) | | | | | |
|---|---|---|---|---|---|---|
| | 50 | 100 | 150 | 200 | 250 | 300 |
| Condition of Wafer | Cracked in heat treatment | ○(no defects were found on a silicon surface) | ○(no defects were found on a silicon surface) | ○(no defects were found on a silicon surface) | ○(no defects were found on a silicon surface) | Cracked when cooled to a room temperature after lamination |

In view of Table 1 and FIG. 2, the wafer laminated at 50° C. was cracked due to the stress in the heating process (S3) before the thinning process (S4) of silicon film due to an insufficient heating during the lamination process (S1). Further, the wafer heated at 300° C. was cracked due to the stress when the temperature was returned to the room temperature (S2).

Example 2

A Silicon wafer was provided so as to have a diameter of 150 mm, a thickness of 625 μm and a 200-nm-thick oxide film thereon. An interface for delamination were formed in the silicon wafer by implanting hydrogen ions (H$^+$) having a dose amount of $5.0 \times 10^{16}$/cm$^2$ from a surface having a silicon oxide film by implantation energy of 60 keV.

The silicon wafer having the delamination interface and a sapphire wafer were placed in a vacuum chamber. After applying a plasma activation treatment to each surface of the silicon wafer and the sapphire wafer, the activated surfaces of these wafers were laminated. The silicon wafer and the sapphire wafer were laminated on a hot plate at 200° C., and then heat-treated at 250° C. for 24 hours. A mechanical impact was applied to the hydrogen ion implantation interface from circumferential surfaces of the silicon wafer. The silicon wafer was delaminated from the sapphire wafer along the hydrogen ion implantation interface to form a silicon film layer on the sapphire wafer. The thickness of the transferred silicon film layer was 400 nm. No defects or cracks were found on the surface of the silicon film layer.

Example 3

A Silicon wafer was provided so as to have a diameter of 150 mm, a thickness of 625 μm and a 200-nm-thick oxide film thereon. An interface for delamination were formed in the silicon wafer by implanting hydrogen ions (H$^+$) having a dose amount of $5.0 \times 10^{16}$/cm$^2$ from a surface having a silicon oxide film by implantation energy of 60 keV.

The silicon wafer having the delamination interface and a sapphire wafer were placed in a vacuum chamber. After subjecting each surface of the silicon wafer and the sapphire wafer to any one of ozone water treatment, DV ozone treatment, ion-beam treatment or plasma activation treatment, the activated surfaces of these wafers were laminated to prepare four samples which were different from each other only in the method of the activation treatment. The silicon wafer and the sapphire wafer were laminated on a hot plate at 200° C., and then heat-treated at 250° C. for 24 hours. A mechanical impact was applied to the hydrogen ion implantation interface from circumferential surfaces of the silicon wafer. The silicon wafer was delaminated from the sapphire wafer along the hydrogen ion implantation interface to form a silicon film layer on the sapphire wafer. The thickness of the transferred silicon film layer was 400 nm. No defects or cracks were found on the surface of the silicon film layer. There was no difference between the four samples. It was found that the quality of the transferred film did not relate to the method of the surface activation.

Having thus described certain embodiments of the present invention, it is to be understood that the invention defined by the appended claims is not to be limited by particular details set forth in the above description as many apparent variations thereof are possible without departing from the spirit or scope thereof as hereinafter claimed. The following claims are provided to ensure that the present application meets all statutory requirements as a priority application in all jurisdictions and shall not be construed as setting forth the full scope of the present invention.

What is claimed is:

1. A method of manufacturing a laminated wafer by forming a silicon film on a surface of a transparent insulating substrate, the method comprising the steps in the following order of:
    implanting ions from a surface of a silicon wafer or a silicon wafer covered with an oxide film to form an ion implantation interface;
    applying a surface activation treatment to the surface of the insulating substrate and/of to the surface of the silicon wafer or the silicon wafer covered with the oxide film to which the ions have been implanted;
    bonding the surface, to which the ions have been implanted, of the silicon wafer or the silicon wafer covered with the oxide film and the surface of the insulating substrate in an atmosphere of temperature exceeding 50° C. and lower than 300° C.;
    applying a heat treatment at 200° C. to 350° C.; and
    applying a mechanical impact to the ion implantation interface so that a silicon film is transferred to form the silicon film layer on the insulating substrate
    wherein the insulating substrate is selected from quartz wafer, sapphire wafer, alumina wafer or glass wafer.

2. The method of manufacturing a laminated wafer according to claim 1, wherein the step of bonding comprises heating, with hot plate apparatus, both of said surface of the insulating substrate and said surface of the silicon wafer or heating only said surface of the insulating substrate.

3. The method of manufacturing a laminated wafer according to claim 1, wherein an etching solution used in the step of thinning comprises a solution of one ore more alkalis selected from a group consisting of KOH, $NH_3$, NaOH, CsOH and $NH_4OH$.

4. The method of manufacturing a laminated wafer according to claim 1, wherein an etching solution used in the step of thinning comprises at least one organic solvent selected from a group consisting of ethylenediamine pyrocatechol water, tetramethylammonium hydroxide, and hydrazine.

5. The method of manufacturing a laminated wafer according to claim 1, wherein a dose amount of hydrogen ions (H+) implanted to the silicon wafer is from $3.0\times10^{16}/cm^2$ to $1.0\times10^{17}/cm^2$ or a dose amount of hydrogen molecule ions (H2+) implanted to the silicon wafer is from $1.5\times10^{16}/cm^2$ to $5.0\times10^{16}/cm^2$.

6. The method of manufacturing a laminated wafer according to claim 1, wherein the root-mean-square roughness of the surface of the silicon wafer and/or the surface of the insulating substrate before the surfaces are bonded is not more than 0.5 nm.

7. A wafer obtained by the method of manufacturing a laminated wafer according to claim 1.

8. A wafer obtained by the method of manufacturing a laminated wafer according to claim 6.

* * * * *